US007894498B2

(12) United States Patent
Miyazaki

(10) Patent No.: US 7,894,498 B2
(45) Date of Patent: Feb. 22, 2011

(54) SEMICONDUCTOR LASER DEVICE AND METHOD FOR MANUFACTURING THE SAME

(75) Inventor: Keisuke Miyazaki, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/195,727

(22) Filed: Aug. 21, 2008

(65) Prior Publication Data
US 2009/0067466 A1 Mar. 12, 2009

(30) Foreign Application Priority Data
Sep. 6, 2007 (JP) ............................. 2007-231536

(51) Int. Cl.
*G02B 26/08* (2006.01)
*H01S 5/00* (2006.01)
(52) U.S. Cl. .................. 372/43.01; 359/196.1; 359/618
(58) Field of Classification Search .............. 372/43.01; 359/196, 618
See application file for complete search history.

(56) References Cited

U.S. PATENT DOCUMENTS

| 2004/0027631 | A1* | 2/2004 | Nagano et al. .............. 359/196 |
| 2004/0091006 | A1* | 5/2004 | Nishiyama et al. ............ 372/36 |
| 2005/0063431 | A1* | 3/2005 | Gallup et al. ................. 372/34 |
| 2005/0167679 | A1* | 8/2005 | Ishii et al. ..................... 257/79 |
| 2005/0274970 | A1* | 12/2005 | Ludowise .................... 257/99 |
| 2008/0279246 | A1* | 11/2008 | Nakatsuka et al. ....... 372/50.12 |

FOREIGN PATENT DOCUMENTS

| JP | 2002-374029 | 12/2002 |
| JP | 2004-356586 | 12/2004 |
| JP | 2005-045146 | 2/2005 |

* cited by examiner

*Primary Examiner*—Minsun Harvey
*Assistant Examiner*—Patrick Stafford
(74) *Attorney, Agent, or Firm*—Nixon & Vanderhye P.C.

(57) ABSTRACT

A semiconductor laser device including a submount having a front surface and a back surface corresponding to the opposing face that are in parallel with each other and a visible light transmittance of 60% or more; a connection electrode that is formed on the front surface; and a semiconductor laser element that is packaged on the submount through the connection electrode, and is allowed to emit a laser beam in a direction parallel to the front surface.

5 Claims, 7 Drawing Sheets

SEMICONDUCTOR LASER DEVICE AND METHOD FOR MANUFACTURING THE SAME

CROSS-REFERENCE TO RELATED APPLICATION

This application is related to Japanese patent application No. 2007-231536 filed on Sep. 6, 2007 whose priority is claimed under 35 USC §119, the disclosure of which is incorporated by reference in its entirety.

BACKGROUND

1. Field of the Technology

The technology presented herein relates to a semiconductor laser device and a method for manufacturing the same, and more specifically, to a semiconductor laser device used for an OA apparatus, such as a copying machine and a laser beam printer, and an optical information processing apparatus, such as an optical fiber communication system, an optical measuring system and an optical disc, and to a method for manufacturing such a semiconductor laser device.

2. Description of the Related Art

In recent years, with respect to OA apparatuses and optical information processing apparatuses provided with a semiconductor laser device, there have been strong demands for high-speed operations and large-size capacities for information processing, and for this reason, the application of a multi-beam semiconductor laser element (hereinafter, referred to also as a multi laser or a laser chip) capable of irradiating a plurality of laser beams has been proposed (refer to, for example, JP-A No. 2002-374029, JP-A No. 2004-356586 and JP-A No. 2005-45146).

The multi laser is provided with a plurality of light emitting units formed on a semiconductor substrate in the form of stripes electrically separated from one another respectively, and a first electrode and a second electrode formed on a surface of each of the light emitting units and a back surface of the substrate on the side opposite to the light emitting units respectively. Moreover, the multi laser is assembled on a submount (referred to also as a heat sink) by using an electrode structure and an packaging system, as shown in FIGS. 6 to 10, so as to allow the respective light emitting units to be driven independently, and then mounted on a package.

The submount is mainly used as a heat radiating member that absorbs heat generated by a laser chip, and releases the heat externally. Here, with respect to the package on which the laser chip is mounted, since it is difficult to call for its mount portion to have flatness against irregularities in the order of several micrometers, and since it is also difficult to adopt a member that is unlikely to transfer a thermal strain to the laser chip (i.e., member having virtually the same thermal expansion coefficient as that of the material of the laser chip) as one portion thereof, the laser chip is generally mounted on the package through the submount. Therefore, the submount is generally required to have a superior heat radiating property, low costs and a thermal expansion coefficient close to that of the material for the laser chip, and generally made from a material such as Si, AlN and SiC.

FIG. 6 shows a state in which a multi laser is packaged on a submount by using a so-called junction-up system. In this case, a multi laser 110 has a structure in which first electrodes 113 are formed on the surfaces of a plurality of light emitting units 112 that are formed on a semiconductor substrate 111 in the form of stripes, with a second electrode 114 being formed on the entire back surface of the semiconductor substrate 111. Moreover, the submount 116 is provided with a connection electrode 117 formed on the entire surface (upper face) thereof.

In the junction-up system, the second electrode 114 on the semiconductor substrate 111 side is electrically connected to the connection electrode 117 on the submount 116 through a solder material. Moreover, the respective first electrodes 113 are electrically connected to an external circuit (not shown) by using wire bonding through wires 118.

FIG. 7 also shows a state in which a multi laser is packaged on a submount by using the junction-up system. In this case, a multi laser 210 has a structure in which a plurality of bonding pads 215 corresponding to a plurality of first electrodes 213 are formed on the two sides of a plurality of light emitting units 212 having the form of stripes, with connecting wires 215a to be used for connecting the respective bonding pads 215 to the respective first electrodes 213 being formed thereon. Among these connecting wires 215a, an insulating film is formed between the first electrode 213 and the connecting electrode 215a that are not to be connected. Moreover, the respective bonding pads 215 are electrically connected to an external circuit (not shown) by using wire bonding through wires 118. Here, in FIG. 7, reference numeral 214 denotes a second electrode, and the same constituent elements as those shown in FIG. 6 are denoted by the same reference numerals.

FIG. 8 shows a state in which a multi laser is packaged on a submount by using a so-called junction-down system. In FIG. 8, the same constituent elements as those shown in FIG. 6 are denoted by the same reference numerals.

In this case, the multi laser 110 explained in FIG. 6 is used. On the other hand, a submount 316 has a structure in which a plurality of connection electrodes 317 are formed on a packaging area on its surface in the form of stripes with the same interval as the interval with which a plurality of first electrodes 113 of the multi laser 110 are arranged side by side, while a plurality of bonding pads 318 and connection wires 319 used for connecting the respective bonding pads 318 to the respective connection electrodes 317 are formed on areas other than the packaging area.

In the junction-down system, the respective first electrodes 113 of the multi laser 110 are electrically connected to the respective connection electrodes 317 through a solder material. Moreover, the respective bonding pads 318 are electrically connected to an external circuit (not shown) by using wire bonding through wires 118.

In the case of the junction-up system shown in FIG. 6, since the plurality of first electrodes 113 are respectively wire-bonded, the width of the first electrodes 113 is required to have such a dimension as not to allow a wire bonding ball to protrude therefrom. For example, supposing that the diameter of the wire 118 is set to 25 μm, which is a general value, since the size of the wire bonding ball is 75 μm or more that is three to four times wider, the width of the first electrodes 113 needs to be set to at least 75 μm. For example, in the case of a laser beam printer, in order to achieve high speed operations, a semiconductor laser element having a narrow light emission-point interval with more light-emission points has been demanded; however, the junction-up system of FIG. 6 in which the first electrodes 113 are limited by the size of the wire bonding ball, as described above, fails to provide an optimal packaging system.

In the case of the junction-up system shown in FIG. 7, since no wire bonding is directly carried out on the first electrodes 213, the light emission-point interval can be made narrower than that of FIG. 6 to, for example, 14 μm; however, since the area used for forming the bonding pads 215 needs to be ensured, the area that does not devote to light emission increases, resulting in an expansion in the chip size of the multi laser.

Moreover, the junction-up system, shown in FIGS. 6 and 7, is disadvantageous in efficiently releasing heat generated from the light emitting unit of the multi laser to the submount, and consequently tends to cause degradation of characteristics as well as degradation of reliability, failing to provide a desirable packaging system.

In the case of the junction-down system shown in FIG. 8, since the multi laser 110 is packaged with the light emitting unit 112 being located closely to the submount 316, this packaging system efficiently releases heat generated from the light emitting unit to the submount. However, upon connecting a plurality of the first electrodes 113 to a plurality of the connection electrodes 317, since it is necessary to melt the solder material and also to carry out the anchoring process, without directly viewing the connection electrodes 317 of the submount 316 and the first electrodes 113 of the multi laser 110, with an electrical separation between the connection electrodes 317 and the first electrodes 113 that are not to be electrically connected to each other being maintained; therefore, this system causes a difficult packaging process, with high positional precision being required. In particular, upon packaging a multi laser having a narrow light emission-point interval (for example, light emission-point interval of 50 μm or less), a more difficult packaging process is required.

When the first electrodes 113 and the connection electrodes 317 are connected to each other with poor positional precision, protruded solder material between the first electrodes 113 and the connection electrodes 317 and positional deviations in die bonding precision tend to occur, resulting in a current leak to subsequently cause degradation of functions and a malfunction in an electronic apparatus provided with the multi laser 110.

SUMMARY

The example embodiment presented herein has been devised to solve the problems, and a feature thereof is to provide a semiconductor laser device having high quality and a method for manufacturing such a semiconductor laser device easily with high precision.

In accordance with the present embodiment, it is possible to provide a semiconductor laser device which includes a submount having a front surface and a back surface corresponding to the opposing face that are in parallel with each other and a visible light transmittance of 60% or more, a connection electrode that is formed on the front surface of the submount and a semiconductor laser element that is packaged on the front surface of the submount through the connection electrode, and is allowed to emit a laser beam in a direction parallel to the front surface.

In particular, the present embodiment is desirably applied to a semiconductor laser device in which the semiconductor laser element includes a semiconductor substrate, a light emitting unit formed on the front surface of the semiconductor substrate, a first electrode formed on a surface of the light emitting unit and a second electrode formed on a back surface of the semiconductor substrate, so that the first electrode of the semiconductor element is packaged on the submount, while being electrically connected to the connection electrode through a solder material.

In another aspect of the present embodiment, the present embodiment relates to a method for manufacturing a semiconductor laser device comprising: a position-adjusting step of: opposing a connection electrode on a submount and a first electrode of a semiconductor laser element to each other; shifting the submount and the semiconductor laser element relative to each other, while a position of the connection electrode and a position of the first electrode are being observed from a back surface side on the side opposite to the connection electrode on the submount; conforming the position of the connection electrode and the position of the first electrode to each other; and a connecting step of: electrically connecting the first electrode of the semiconductor laser element to the connection electrode of the submount through a solder material.

In accordance with the method for manufacturing a semiconductor laser device of the present embodiment, while the position of the connection electrode and the position of the first electrode are being observed from the back surface side of the submount by utilizing the light transmitting property of the submount having a visible light transmittance of 60% or more, the position of the connection electrode and the position of the first electrode can be made coincident with each other easily with high precision. Therefore, in particular, even in the case where multi lasers having a narrow light emission-interval of 50 μm or less are packaged on the submount by using a junction-down system, defects, such as a protruded solder material between the first electrode and the connection electrode and positional deviations in die bond precision, do not occur, thereby making it possible to prevent current leak. Moreover, by using the junction-down packaging system, it becomes possible to efficiently release heat generated by the semiconductor laser element to the submount.

Therefore, since the semiconductor laser device obtained by this manufacturing method is allowed to have improved characteristics and reliability, an OA apparatus, a communication apparatus or the like provided with this semiconductor laser device is allowed to execute higher speed operations.

DETAILED DESCRIPTION

Figure 1:
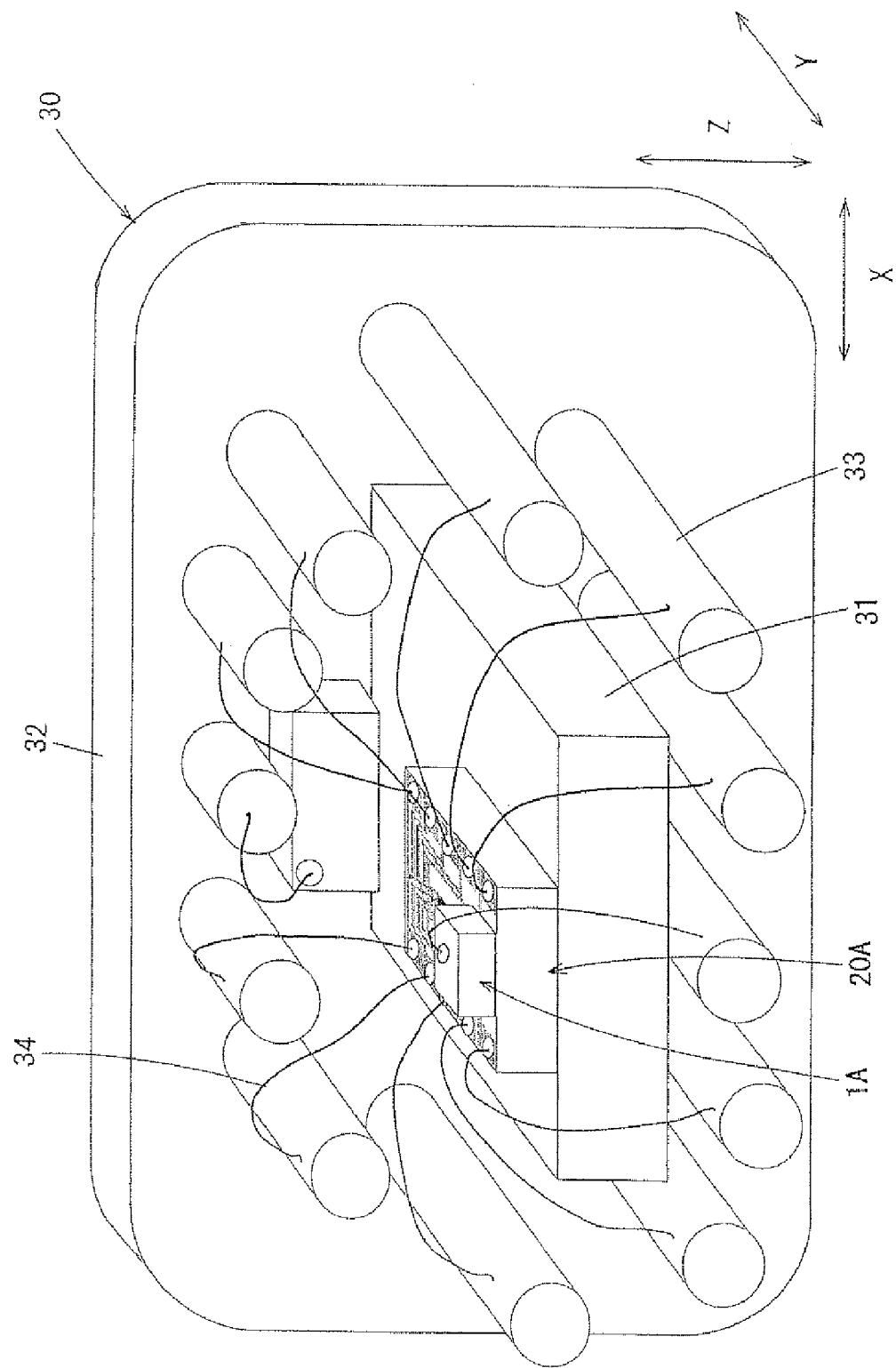
FIG. 1 is a perspective view showing Embodiment 1 of a semiconductor laser device; accordance with the present invention.

A semiconductor laser device in accordance with the present embodiment includes a submount having a front surface and a back surface corresponding to the opposing face that are in parallel with each other and a visible light transmittance of 60% or more; a connection electrode that is formed on the front surface; and a semiconductor laser element that is packaged on the submount through the connection electrode, and is allowed to emit a laser beam in a direction parallel to the front surface.

That is, since this semiconductor laser device is provided with the submount having a superior light transmitting property with a visible light transmittance of 60% or more, the position of the connection electrode and the position of the semiconductor element can be observed by using observing means from the back surface side opposite to the connection electrode of the submount.

This observing process is carried out upon packaging the semiconductor laser element on the submount with the connection electrode interposed therebetween, and the positioning precision of the connection electrode and the semiconductor laser element can be improved by using this process.

Therefore, the semiconductor laser device of the present embodiment has a structure in which the semiconductor laser element is position-adjusted and packaged on the submount with high precision.

Here, in a case where the visible light transmittance of the submount is lower than 60%, the position observation of the connection electrode and the semiconductor laser element from the back surface side of the submount tends to become difficult, resulting in a reduction in the positional precision of the connection electrode and the semiconductor laser element.

In the present embodiment, "visible light transmittance" refers to a percentage of a ratio It/Io, that is, a ratio between luminous intensity Io of light (wavelength: 400 to 750 nm) that is made incident vertically on one face of a submount having a surface and the other surface in parallel with each other, with a thickness from the surface to the other surface of 0.01 to 2.0 mm, and luminous intensity It of light released from the other face after passing through the inside of the submount.

Except for the above-mentioned structure, the semiconductor laser device of the present embodiment is not particularly limited, and the following structures are preferably proposed.

In the present embodiment, materials and surface states of the submount are not particularly limited, as long as the visible light transmittance is not less than 60%; however, with respect to the surface roughness of the front surface and the back surface corresponding to the opposing face of the submount, the ten-point average roughness Rz, defined by JIS B0106-1994, is preferably set to 1 μm or less, so as to easily obtain the submount having a visible light transmittance of 60% or more, and it is more preferably set to 0.2 μm or less. In a case where the surface roughness (ten-point average roughness Rz) of the front surface and the back surface corresponding to the opposing face of the submount exceeds 1 μm, the limitation of materials used for obtaining the submount having a visible light transmittance of 60% or more becomes severer.

In addition to the feature that the visible light transmittance exceeds 60%, from the viewpoints of a superior heat radiating property, low costs and having a thermal expansion coefficient close to that of the semiconductor laser element, GaN, sapphire or $SiO_2$ is preferably used as the material for the submount. The visible light transmittances of GaN, sapphire and $SiO_2$ are about 70%, about 85% and about 90%, respectively.

Moreover, the shape and the size of the submount are not particularly limited as long as there are a front surface on which the connection electrode is formed and a back surface corresponding to the opposite surface, with the front surface and the back surface being in parallel with each other; and preferably, a square block shape having a longer side in a range from 500 to 1500 μm, a shorter side in a range from 500 to 1000 μm and a thickness of 200 to 400 μm is used.

The submount may be manufactured through processes in which the front surface and back surface of a wafer made from the material (for example, GaN wafer) are mirror-face-polished to a predetermined thickness, and the wafer having been polished is divided into a predetermined size. Specifically, the front surface and the back surface of the submount do not form smooth faces, and have fine irregularities (surface roughness), and the front surface and back surface of the wafer are preferably polished so that the ten-point average roughness Rz, defined by JIS B0106-1994 corresponding to this surface roughness, is set to 1 μm or less. In this case, for example, a chemical mechanical polishing method or the like may be used as the polishing method.

In the present embodiment, the semiconductor laser element may include a semiconductor substrate, a light emitting unit formed on a front surface of the semiconductor substrate, a first electrode formed on a surface of the light emitting unit and a second electrode formed on a back surface of the semiconductor substrate, so that the first electrode of the semiconductor laser element is electrically connected to the connection electrode on the submount through a solder material.

According to such a configuration, a semiconductor laser device, which is packaged by using a junction-down system that is advantageous for radiating heat generated by the light-emitting unit of the semiconductor laser element, can be obtained so that it is possible to restrain degradations of characteristics and reliability due to heat generation of the semiconductor laser element.

Moreover, the present embodiment is desirably used as a semiconductor laser device in which, in the semiconductor laser element, a plurality of the light-emitting units are formed on the front surface of the semiconductor substrate in the form of stripes in a manner so as to be electrically separated from one another and the first electrodes are respectively formed on the surfaces of the respective light emitting units, with a plurality of the connection electrodes being formed on the surface of the submount in the form of stripes, that is, as a semiconductor laser device in which multi laser is packaged on the submount by using the junction down system.

According to such a configuration, it is possible to allow an OA apparatus and an optical information processing apparatus, provided with this semiconductor laser device, to execute high-speed operations and also to provide large-capacity information processing operations. Moreover, since the submount is superior in light transmitting property, as described earlier, the first electrodes can be joined to a plurality of connection electrodes with high precision, without having any positional deviations, and the present invention is desirably applied to a semiconductor laser device in which micro multi-laser with a narrow light emission-point interval of 50 μm or less is packaged by using the junction-down system. Moreover, since the junction-down packaging system is used, heat generated from the light emitting units of the multi-laser can be efficiently released to the submount.

In the present embodiment, the multi-laser may be designed so as to emit a plurality of laser beams having different oscillating wavelengths or the same oscillating wavelength.

In any of the structures of emitting laser beams having different oscillating wavelengths and of emitting laser beams having the same oscillating wavelength, the respective channel electrodes (connection electrodes) on the submount side to be placed in accordance with the light-emission points can be positioned with high precision so that the yield and the heat-radiating property can be stabilized and improved.

As long as it has a structure in which the light-emitting unit is formed on the front surface of the semiconductor substrate and the first electrode is formed on the surface side of the light-emitting unit, with the second electrode being formed on the back surface of the semiconductor substrate, not limited to specific series of materials, the semiconductor laser element of the present invention may be made from any materials, such as GaAs-based, AlGaAs-based, GaInAs-based, GaInAsP-based and AlGaInP-based materials.

Here, the light-emitting unit is not particularly limited, as long as it has a structure provided with at least an active layer having a light-emitting point that emits a laser beam, and, for example, a multiplex quantum well structure is prepared as the active layer. Moreover, the light-emitting unit may include a unit having a ridge structure, and in addition to this structure, it may have a first conductive clad layer formed between the semiconductor substrate and the active layer, and also may have a second conductive clad layer formed between the active layer and the first electrode. A first conductive buffer layer may be formed between the semiconductor substrate and the first conductive clad layer. Furthermore, the light-emitting unit of the semiconductor laser element of the present embodiment also includes layer structures, such as those in which at least one of the first conductive clad layer and the second conductive clad layer is constituted by a plurality of layers, those in which two second conductive clad layers are prepared, with an etching stop layer being formed between the two layers, those in which dielectric layers having an insulating property are formed on the two sides of a ridge structure, and those in which an insulating film, a protective film and the like are formed as upper layers from the ridge structure. conductive clad layer formed between the semiconductor substrate and the active layer, and also may have a second conductive clad layer formed between the active layer and the first electrode. A first conductive buffer layer may be formed between the semiconductor substrate and the first conductive clad layer. Furthermore, the light-emitting unit of the semiconductor laser element of the present invention also includes layer structures, such as those in which at least one of the first conductive clad layer and the second conductive clad layer is constituted by a plurality of layers, those in which two second conductive clad layers are prepared, with an etching stop layer being formed between the two layers, those in which dielectric layers having an insulating property are formed on the two sides of a ridge structure, and those in which an insulating film, a protective film and the like are formed as upper layers from the ridge structure.

Not limited to the structure that is provided with a submount having a visible light transmittance of 60% or more and a semiconductor laser element packaged on the submount, with a connection electrode being interposed therebetween, the semiconductor laser device of the present embodiment may have a package to be used for anchoring the submount with the semiconductor laser element packaged thereon by using a conductive paste. This package may be made from a material such as copper and iron, and in particular, copper that is a material superior in thermal conductivity (heat radiating property) with an insulating property is preferably used.

Here, the submount may have a plurality of bonding pads and connecting wiring used for connecting the respective bonding pads to respective connection electrodes, which are formed on an area other than the packaging area on the surface, and the package may have a plurality of connection terminals that are electrically connected to the bonding pads on the submount through conductive wires.

The semiconductor laser device having the above-mentioned structure can be produced by a manufacturing method comprising: a position-adjusting step of: opposing a connection electrode on a submount and a first electrode of a semiconductor laser element to each other; shifting the submount and the semiconductor laser element relative to each other, while a position of the connection electrode and a position of the first electrode are being observed from a back surface side on the side opposite to the connection electrode on the submount; conforming the position of the connection electrode and the position of the first electrode to each other; and a connecting step of: electrically connecting the first electrode of the semiconductor laser element to the connection electrode of the submount through a solder material.

In accordance with this manufacturing method, by utilizing the light transmitting property of the submount having a visible light transmittance of 60% or more, the position of the connection electrode and the position of the first electrode can be easily made coincident with each other with high precision, while observing the position of the connection electrode and the position of the first electrode from the back surface side of the submount. Therefore, in particular, even when multi-laser having a narrow light emission-point interval of 50 µm or less are packaged on the submount by using the junction-down system, defects, such as a protruded solder material between the first electrode and the connection electrode and positional deviations in die bond precision, do not occur, thereby making it possible to prevent current leak conventionally caused by these defects.

In the position adjusting process, although not particularly limited, the observation of the position of the connection electrode and the position of the first electrode may be carried out by using, for example, a method using a CCD camera or a method in which a laser beam is emitted to the back surface of the submount and the laser beam reflected from the connection electrode and the first electrode is detected may be used.

Referring to Figures, the following description will discuss a semiconductor laser device and a manufacturing method thereof in accordance with embodiments.

Embodiment 1

FIG. 1 is a perspective view showing Embodiment 1 of a semiconductor laser device. This semiconductor laser device is provided with a semiconductor laser element 1A, a submount 20A on which the semiconductor laser element 1A is packaged and a package 30 on which the submount 20A is packaged.

Figure 2A:
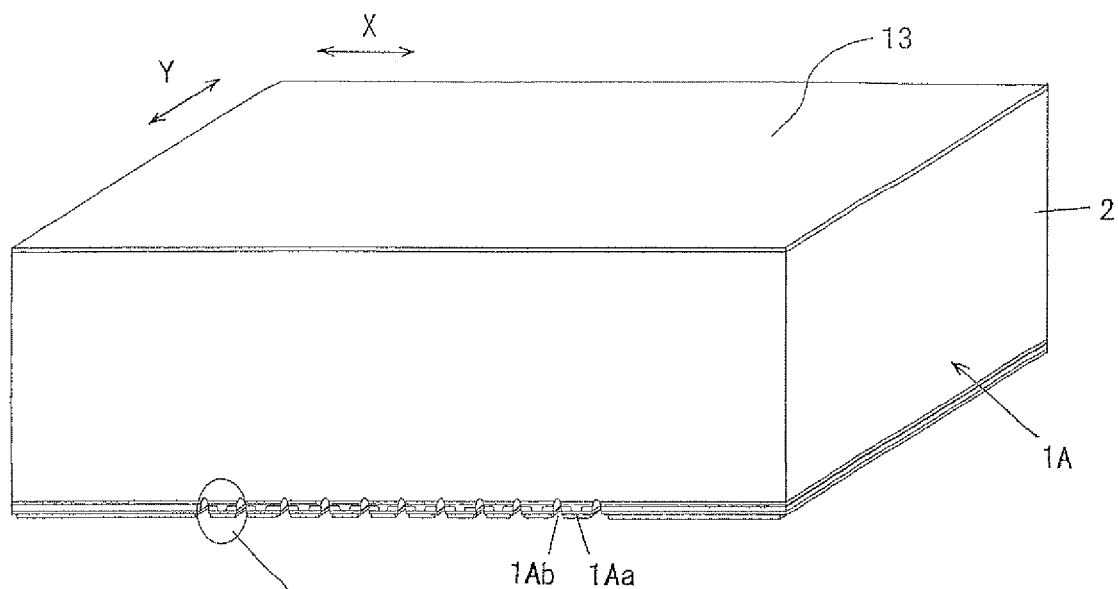
FIG. 2A is a perspective view showing a semiconductor laser element in Embodiment 1.
Figure 2B:
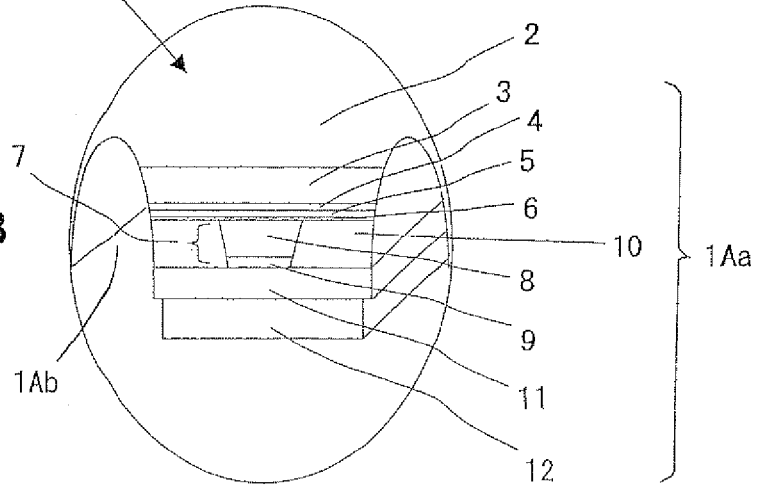
FIG. 2B is a partially expanded view of the semiconductor laser element of FIG. 2A.
Figure 3:
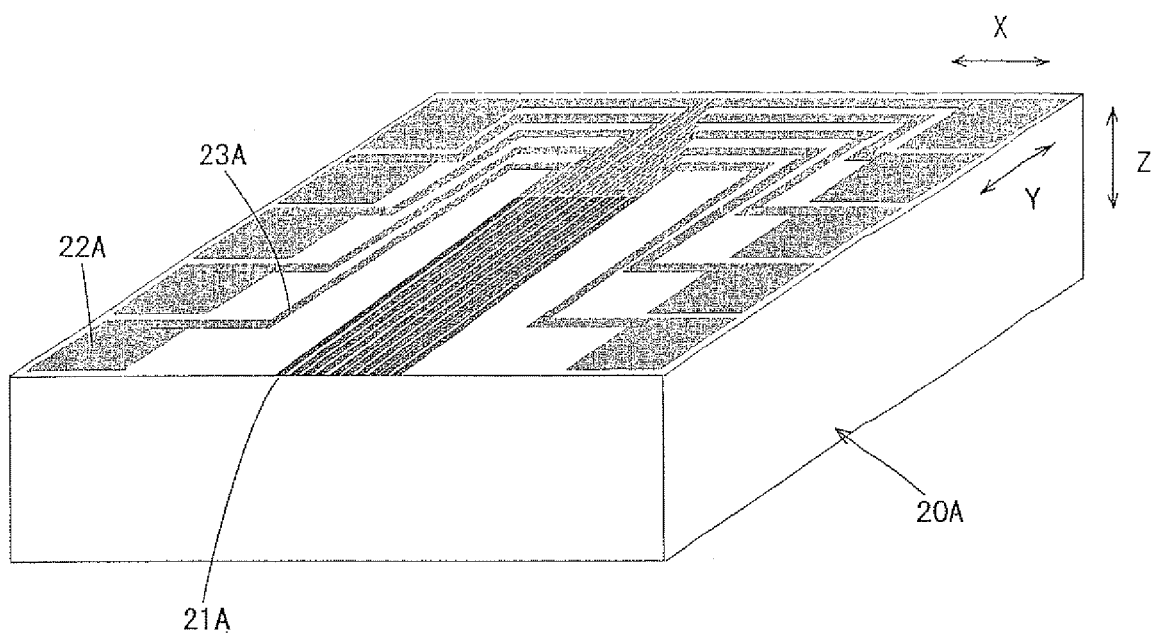
FIG. 3 is a perspective view showing a submount in Embodiment 1.

FIG. 2A is a perspective view showing the semiconductor laser element in Embodiment 1, and FIG. 2B is a partially expanded view of the semiconductor laser element of FIG. 2A. FIG. 3 is a perspective view showing a submount in Embodiment 1.

As shown in FIGS. 2A and 2B, the semiconductor laser element 1A is provided with a N-type GaAs substrate 2 having a width of 200 µm (X-direction), a length of 300 µm (Y-direction) and a thickness of 500 µm, and corresponds to an infrared ten channel laser chip in which ten light-emitting units 1Aa are formed as stripe shape with a light-emission point interval of 10 µm within the width of the N-type GaAs substrate 2. A separation groove 1Ab is formed between the respective light-emitting units 1Aa.

Each light-emitting unit 1Aa is provided with a N-type AlGaAs clad layer 3 (film thickness: 2.2 μm), a non-doped AlGaAs multiplex quantum well active layer 4 (film thickness: 0.12 μm), a P-type AlGaAs first clad layer 5 (film thickness: 0.17 μm), a GaAs epi-support layer 6 (film thickness: 0.003 μm) serving as a base of a ridge portion 7, and a P-type AlGaAs second clad layer 8 (film thickness: 1.2 μm) and a P-type GaAs cap layer 9 (film thickness: 0.8 μm) as the ridge portion 7 having a width of 2.5 μm forming a waveguide path, which are successively formed on a N-type GaAs substrate 2, and N-type AlGaAs block layers 10 (film thickness: 2.0 μm) having current block function and such a refractive index as to confine light inside the active layer 4 in lateral directions are formed on the two sides of the ridge portion 7.

The non-doped AlGaAs multiplex quantum well active layer 4 is provided with a pair of non-doped AlGaAs guide layers formed in contact with the N-type AlGaAs clad layer 3 and the P-type AlGaAs first clad layer 5, and non-doped AlGaAs well layers (film thickness: 0.0075 μm) and non-doped AlGaAs barrier layers (film thickness: 0.0055 μm) that are alternately formed between the paired non-doped AlGaAs guide layers, and the non-doped AlGaAs well layers are placed so as to be made in contact with the non-doped AlGaAs guide layers.

Moreover, a P-type electrode 11 and an Au plated electrode 12 (the first electrode) are formed on the P-type GaAs cap layer 9 and the N-type AlGaAs block layer 10 of the light-emitting unit 1Aa. The P-type electrode 11 has a laminated structure formed by a Ti layer (film thickness: 0.05 μm), an Mo layer (film thickness: 0.2 μm) and an Au layer (film thickness: 0.2 μm) successively laminated from the ridge portion 7 side. The Au plated electrode 12 has a width of 6 μm and a film thickness of 3.0 μm.

On the other hand, on back surface of the N-type GaAs substrate 2, a N-type electrode 13 (the second electrode) is formed with a laminated structure constituted by AuGe layer (film thickness: 0.15 μm), Ni layer (film thickness: 0.05 μm), Mo layer (film thickness: 0.15 μm) and Au layer (film thickness: 0.2 μm) successively laminated from the substrate side.

As shown in FIG. 3, the submount 20A has a square block shape made of GaN, having a width of 500 μm (X-direction), a length of 400 μm (Y-direction) and a thickness of 300 μm. The submount 20A has a visible light transmittance of about 65%.

On the front surface (one face) of the submount 20A, ten connection electrodes 21A that extend in the Y-direction are formed in parallel with one another in the X-direction. Connection electrodes 21A, each having a width of 6 μm (X-direction) and a length of 300 μm (Y-direction), extend in the Y-direction (rearward) from one side (front side) in the X-direction of the submount 20A, and are placed near the mid position of the one side in the X-direction, with a pitch of 10 μm.

Moreover, on a non-packaging area on the front surface of the submount 20A, ten bonding pads 22 and connection wires 23 that electrically connect the respective bonding pads 22 to the respective connection electrodes 21A are formed. Ten of the bonding pads 22 are placed along each of the two opposing sides of the submount 20A in the Y-direction. Each of the connection wires 23 connects the end portion of each connection electrode 21A located near the center of the front surface of the submount 20A to each bonding pad 22 in a separated manner so as not to come close to the stripes of the connection electrodes 21A.

As shown in FIG. 1, the package 30 is provided with a mount portion 31 having a square block shape, on which the submount 20A bearing the packaged semiconductor laser element 1A is packaged through silver paste, a plate-shaped base portion 32 extending in a perpendicular direction, which is integrally formed to be connected to the rear end of the mount portion 31, and a plurality of connection terminals 33 that penetrate the base portion 32 and protrude the mount portion 31 side.

The mount portion 31 has a width of 1.4 mm (X-direction), a length of 1.3 mm (Y-direction) and a thickness of 1.1 mm (Z-direction), and the base portion 32 has a width of 8.2 mm (X-direction), a length of 4.8 mm (Y-direction) and a thickness of 1.2 mm (Z-direction), and the material of these members is copper.

The connection terminals 33, each prepared as a copper wire having a diameter of 0.4 μm, are placed on the periphery of the mount portion 31. Among the connection terminals 33, those connection terminals 33, located above the mount portion 31, are shortened in such a degree as not to intervene with the packaging process of the submount 20A, while the other connection terminals are elongated. Here, the respective connection terminals 33 and the respective bonding pads 22 of the submount 20A are wire-bonded to each other through gold wires 34, with the connection terminal 33 and the N-type electrode 13 of the semiconductor laser element 1A being wire-bonded to each other through gold wire 34.

The semiconductor laser device, formed in this manner, is assembled into an OA apparatus (for example, a laser printer), an optical information processing apparatus (for example, an optical fiber communication system, an optical measuring system, an optical disc device), or the like.

Embodiment 2

Embodiment 1 has been explained by exemplifying a semiconductor laser device provided with an infrared laser chip with ten channels; however, the number of light emitting units, the intervals of the light-emission points and the like can be freely modified in designing, and, for example, as shown in FIG. 5, a semiconductor laser device having a semiconductor laser element 1B (a laser chip with four channels) provided with four light-emitting units 1Aa with a light emission-point interval of 14 μm may be adopted.

Other Embodiments

Not limited to those described in Embodiments 1 and 2, the film thicknesses and materials of the respective layers forming the semiconductor laser element, the number of the light emitting units, the light emission-point interval and the like may be modified in designing on demand, in accordance with characteristics of a semiconductor laser element to be obtained.

EXAMPLE 1

A semiconductor laser device having a structure and various dimensions explained in Embodiment 1 (FIGS. 1 to 3) was manufactured as explained below.

[Preparation of Semiconductor Laser Element]

First, on a front surface of a N-type GaAs substrate 2 having a wafer shape with a thickness of 500 μm, a N-type AlGaAs clad layer 3, a non-doped AlGaAs multiplex quantum well active layer 4, a P-type AlGaAs first clad layer 5, a GaAs epi-support layer 6 to be required upon forming ridge portions 7 and used for a base layer upon re-growing a block layer, a P-type AlGaAs second clad layer 8 and a P-type GaAs cap layer 9 were allowed to successively grow by using a MOCVD (Metal Organic Chemical Vapor Deposition) method.

Next, the P-type AlGaAs second clad layer 8 and the P-type GaAs cap layer 9 were subjected to a photolithographic method and a wet-etching method so that a plurality of pre-determined portions thereof were left so as to form ten ridge portions 7.

Successively, a N-type AlGaAs block layer 10 was formed by the MOCVD method in a manner so as to cover the respective ridge portions 7, and the N-type AlGaAs block layers 10 on the respective ridge portions 7 were removed by a photolithography method and a wet-etching method. Thus, a laminated body having each chip-size width of 200 μm, with ten ridge portions 7 to form waveguide paths being formed therein with a pitch of 10 μm, was formed.

Next, a Ti layer, a Pt layer and an Au layer, used for forming a P-type electrode 11, were vapor-deposited on the ridge portions 7 and the N-type AlGaAs block layer 10 of the laminated body, by using a sputtering method.

Successively, the surface of the laminated body was Au-plated so that a P-type plated electrode 12 was formed on the Au layer of the P-type electrode 11.

Next, a portion between the respective ridge portions 7 was removed from the P-type plated electrode 12 down to a pre-determined depth (about 10 μm) of the N-type GaAs substrate 2 by using a photolithography method and a dry etching method so that a separation groove 1Ab was formed so as to inject an electric current to each of the ridge portions 7 independently.

After the back surface of the N-type GaAs substrate 2 had been subjected to a chemical mechanical polishing process until the chip thickness had been set to 100 μm, an AuGe layer (film thickness: 0.15 μm), an Ni layer (film thickness: 0.05 μm), an Mo layer (film thickness: 0.15 μm) and an Au layer (film thickness: 0.2 μm) to be formed into an N-type electrode 13 were vapor-deposited on the back surface of the N-type GaAs substrate 2 by using a sputtering method, and the laminated body was divided into chip units, each having a chip width of 200 μm and a resonator length of 300 μm, by using a scribing device; thus, a semiconductor laser element was manufactured.

[Preparation of Submount and Connection Electrodes]

The two surfaces of a GaN wafer having a wafer thickness of 500 μm were subjected to a chemical mechanical polishing process until the wafer thickness had been set to 300 μm corresponding to a submount thickness. The ten-point average roughness Rz corresponding to the surface roughness of each of the front surface and the back surface of the GaN wafer after the polishing process was measured by a surface step meter made by KLA-Tencor Technologies Corp. to find that Rz=0.12 μm.

Thereafter, a Ti layer (film thickness: 0.05 μm), an Mo layer (film thickness: 0.2 μm) and an Au layer (film thickness: 0.2 μm) were laminated on the front surface of the GaN wafer in this order through sputter vapor deposition, those areas except for the respective formation areas of the connection electrodes, connection wires and bonding pads on these three layers were removed by using a photolithography method and a dry-etching method so that the front surface of the submount was exposed; thus, connection electrodes 21A used for ten channels, connection wires 23 and bonding pads 22 were formed.

Next, a P layer and an AuSn layer, serving as a solder material, were formed on the respective connection electrodes 21A with a total thickness of 2 μm by using a lift-off operation utilizing vapor deposition by the use of resistor heating and a photolithography process, and the resulting GaN wafer was then divided by a dicing device into the submount size so that a submount 20A was manufactured.

[Packaging of Semiconductor Laser Element]

Figure 4:
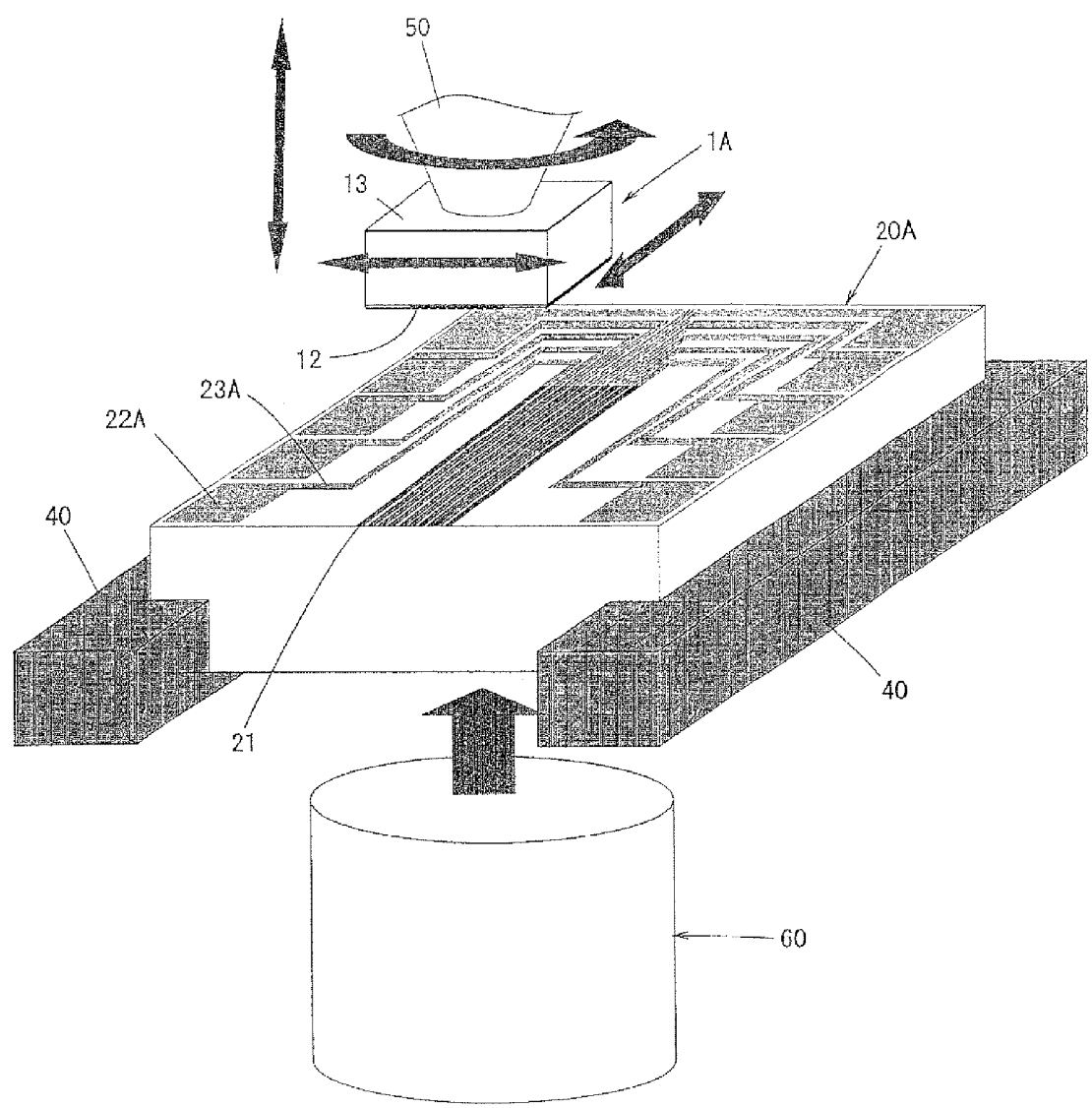
FIG. 4 is a view for explaining a packaging process in which the semiconductor laser element of Example 1 is packaged on the submount.

FIG. 4 is a view for explaining a packaging process used for packaging the semiconductor laser element 1A of Example 1 onto the submount 20A.

In the packaging process, as shown in FIG. 4, the two sides of the submount 20A were held by a pair of heater blocks 40, and the N-type GaAs electrode 13 of the semiconductor laser element 1A was suction-held by a suction head 50 of suction shifting means, and moved to a proximate position above the submount 20A.

The paired heater blocks 40 have a heater installed therein, and is attached to an opening/closing mechanism (not shown) so as to be opened and closed. Moreover, the respective heater blocks 40 have cut-out portions to which the lower two sides of the semiconductor laser element 1A are fitted, at positions opposing to the two sides.

Suction shifting means 50 is attached to a shifting mechanism unit (not shown) in a manner so as to allow the suction head 50 to move forward and rearward, leftward and rightward, as well as upward and downward, and also to rotate around the vertical shaft. Here, the suction head 50 has an opening on its lower end, and this opening is connected to a vacuum pump through a flexible hose, not shown, and the vacuum pump subjects the inside of the suction head 50 to a negative pressure through the flexible hose so that the semi-conductor laser element 1A is sucked.

A CCD camera 60 is placed below the submount 20A that is held by the paired heater blocks 40, and this CCD camera 60 is connected to a display device (not shown) so that an image captured by the CCD camera 60 is displayed by the display device.

As shown in FIG. 4, after the semiconductor laser element 1A and the submount 20A had been set, position-adjusting processes were carried out. At this time, images of a plurality of the connection electrodes 21A and a plurality of P-type plated electrodes 12 of the semiconductor laser element 1A were captured by the CCD camera 60 through the submount 20A, and these images were displayed by the display device. The operator observes the positions of the respective connection electrodes 21A and the positions of the respective P-type plated electrodes 12 by viewing the images, and carries out position-adjusting processes by shifting the suction head 50 so as to make the positions of the respective connection electrodes 21A and the positions of the respective P-type plated electrodes 12 coincident with each other.

During this time, by heating the paired heater blocks 40 to 300° C., the submount 20A was heated so that the solder material on the respective connection electrodes 21A was melted.

When the positions of the respective connection electrodes 21A and the positions of the respective P-type plated electrodes 12 were made coincident with each other, the semi-conductor laser element 1A was lowered vertically so that the respective P-type plated electrodes 12 were pressed onto the solder material on the respective connection electrodes 21A; thus, the solder material and the P-type plated electrodes 12 (Au plated electrodes) were formed into an alloy, and quickly cooled and anchored thereon. In the case of cooling quickly, the heating process of the paired heater blocks 40 was stopped, and air was locally applied mainly to the joining portions to be cooled, by using air blowing means (not shown).

After packaging the semiconductor laser element 1A, the joined portions were observed by using the CCD camera 60, and it was confirmed that neither protruded portions of the solder material nor positional deviations in die bonding occurred.

Thereafter, as shown in FIG. 1, the submount 20A bearing the packaged semiconductor laser element 1A was taken out of the paired heater blocks 40, and carried by using transporting means (not shown), and then anchored on the mount portion 31 of the package 30 by silver paste.

The respective bonding pads 22 (see FIG. 3) on the submount 20A and the respective connection terminals 33 were wire-bonded to each other by gold wires 34, with the N-type electrodes 13 of the semiconductor laser element 1A and the connection terminals 33 being wire-bonded to each other by gold wires 34, so that a semiconductor laser device, provided with a laser chip having infrared ten channels with a light emission-point interval of 10 μm, capable of being driven independently, was manufactured.

EXAMPLE 2

Semiconductor laser devices provided with a semiconductor laser element 1B explained in Embodiment 2 (FIG. 5) were prepared. In Example 2, the semiconductor laser element 1B was manufactured in the same manner as in Example 1 except that the number of the light-emitting units 1Aa and the light emission-point interval were made different from those of Example 1. Moreover, in Example 2, the submount 20B was manufactured in the same manner as in Example 1, except that the material was made different from that of Example 1, and the connection electrodes 21B were formed in the same manner as in Example 1, except that the number and the interval thereof were made different from those of Example 1.

In Example 2, upon packaging the semiconductor laser element 1B onto the submount 20B, position adjusting processes, different from those of Example 1, were carried out as explained below.

[Packaging of Semiconductor Laser Element]

FIGS. 5A to 5D are views for explaining a packaging process used for packaging the semiconductor laser element 1B of Example 2 onto the submount 20B.

In Example 2, a laser beam was emitted to the back surface of the submount 20B, and the laser beam reflected by the connection electrodes and the first electrode after passing through the submount 20B was detected so that the positions of the connection electrodes and the positions of the first electrodes were observed.

Figure 5A:
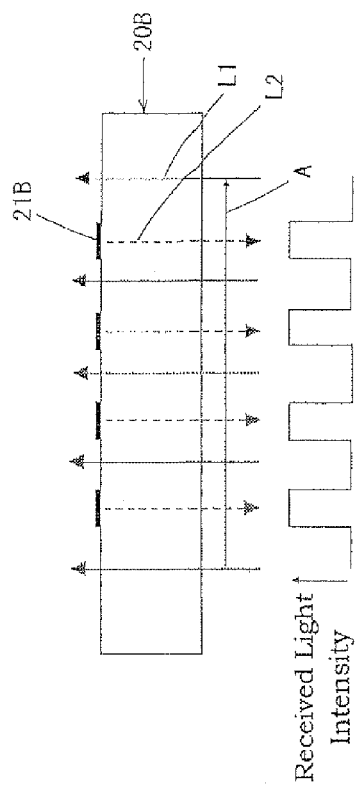
FIGS. 5A to 5D are views for explaining packaging processes in which the semiconductor laser element of Example 2 is packaged on the submount.

In the position adjusting process, first, as shown in FIG. 5A, the semiconductor laser element 1B was shifted above the submount 20B. Here, in the same manner as in Example 1, the submount 20 was held by the heater blocks 40, and the semiconductor laser element 1B was shifted by using the suction head 50 of the suction shifting means (see FIG. 4).

Next, a laser beam was emitted to the back surface of the submount 20B from a laser light emitting unit of laser light scanning means (not shown) that was placed below the submount 20B, and by shifting the laser light emitting unit in a direction traversing the connection electrodes 21B (in a direction of arrow A in FIG. 5B) at right angles, the laser beam was emitted to a range exceeding the area of the connection electrodes 21B so that the positions of the connection electrodes 21B were scanned. Here, a semiconductor laser beam having a wavelength of 660 nm was used as the light source of this laser beam, and the laser beam was emitted with an output of 10 mW.

Figure 5B:
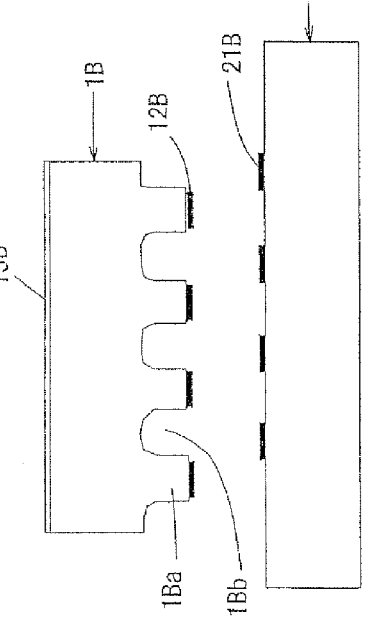
Figure 5C:
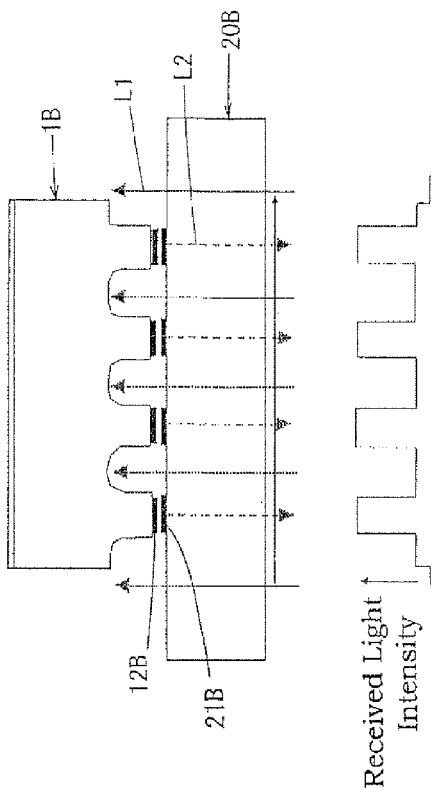
Figure 5D:
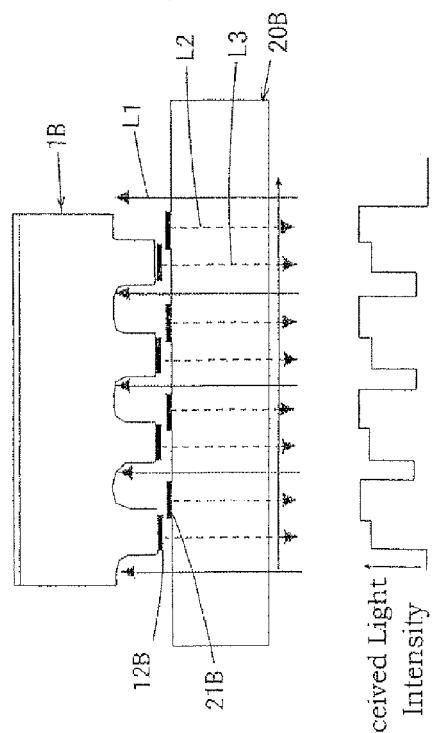
Figure 6:
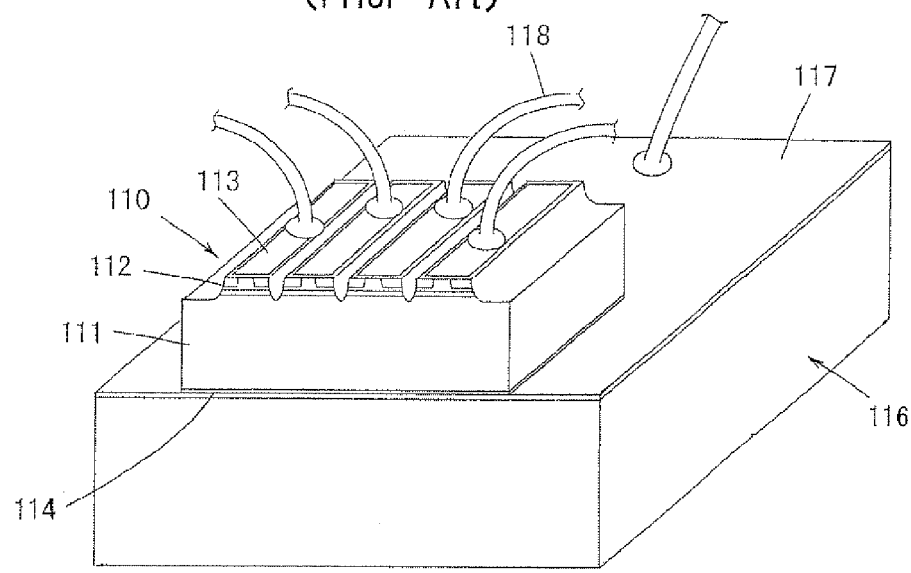
FIG. 6 is a perspective view showing a state in which multi laser is packaged on a submount by using a conventional junction-up system.
Figure 7:
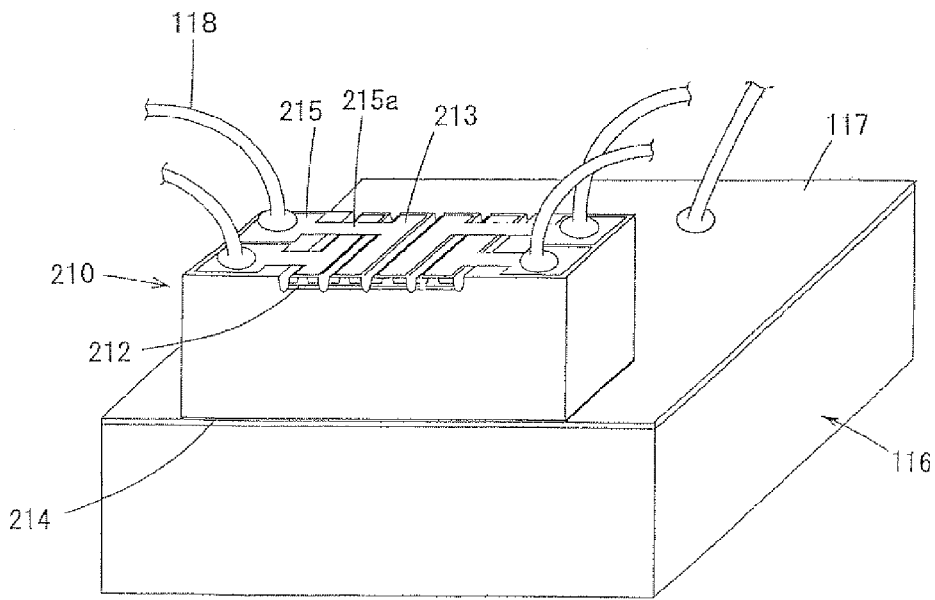
FIG. 7 is a perspective view showing a state in which other multi laser is packaged on a submout by using the conventional junction-up system.
Figure 8:
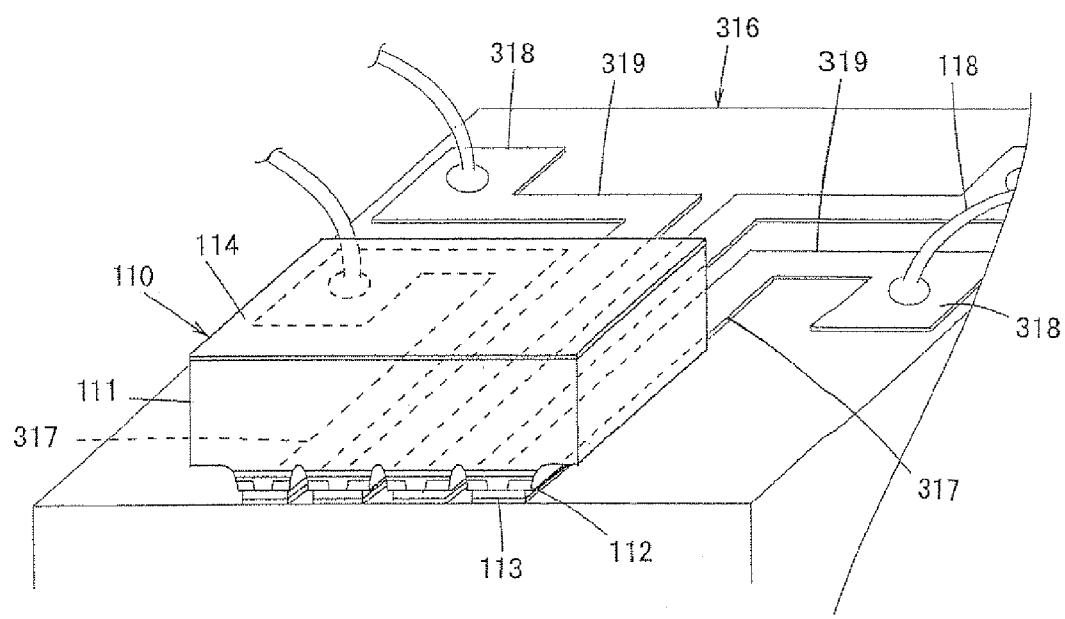
FIG. 8 is a perspective view showing a state in which multi laser is packaged on a submount by using a conventional junction-down system.

FIGS. 5B to 5D show the concept of position-observing processes by the laser scanning means. As shown in FIG. 5B, in a case where the semiconductor laser element is not located closely to the submount 20B, a laser incident beam L1 is allowed to pass through the submount 20B, and one portion thereof hits the connection electrodes 21B and is reflected therefrom so that the resulting reflected laser beam L2 is detected by a laser light detection unit of the laser light scanning means, and displayed on a display unit (not shown) as waveforms indicating the received light intensity.

As shown in FIG. 5C, in a case where the semiconductor laser element 1B, placed closely to the submount 20B, is scanned by a laser beam, if the positions of the respective P-type plated electrodes 12B of the semiconductor laser element 1B and the positions of the respective connection electrodes 21B are not coincident with each other, a laser reflected light L2 reflected at the connection electrodes 21B and a laser reflected light L3 reflected at the P-type plated electrodes 12B are detected. At this time, since the connection electrodes 21B and the P-type plated electrodes 12B are arranged side by side as seen from back surface of submount 20B and since the distance from the laser light detection unit to the P-type plated electrodes 12B is longer than the distance from the laser light detection unit to the connection electrodes 21B, a waveform derived from a slightly weaker received light intensity of the laser reflected light L3 is displayed adjacent to a waveform derived from a received light intensity of the laser reflected light L2.

Based upon the above-mentioned concept of the positional observation, as shown in FIG. 3D, the semiconductor laser element 1B is position-adjusted so that the waveform of the received light intensity derived from the laser reflected light L3 is eliminated; thus, the positions of the respective P-type plated electrodes 12B are made coincident with the positions of the respective connection electrodes 21B.

Thereafter, in the same manner as in Example 1, the semiconductor laser element 1B is lowered vertically, and the respective P-type plated electrodes 12B are subsequently pressed onto the solder material on the respective connection electrodes 21B so that the solder material and the P-type plated electrodes 12B are formed into an alloy and anchored thereon while being quickly cooled.

Moreover, in the same manner as in Example 1, the submount 20B bearing the packaged semiconductor laser element 1B is anchored on the mount portion 31 of the package 30 by using silver paste, and the respective bonding pads (see FIG. 3) on the submount 20B are wire-bonded to the respective connection terminals 33 by using gold wires 34, with the N-type electrodes 13B of the semiconductor laser element 1B and the connection terminals 33 being wire-bonded by gold wires 34, so that a semiconductor laser device, provided with a laser chip having infrared four channels with a light emission-point interval of 14 μm that can be driven independently, is manufactured.

What is claimed is:
1. A semiconductor laser device comprising:
a submount having a front surface and a back surface corresponding to the opposing face that are in parallel with each other and a visible light transmittance of 60% or more;
a connection electrode that is formed on the front surface; and a semiconductor laser element that is packaged on the submount through the connection electrode, and is allowed to emit a laser beam in a direction parallel to the front surface, wherein each of the front surface and the back surface of the submount is allowed to have a ten-point average roughness Rz of 1 μm or less, defined by JIS B0106-1994, and wherein the semiconductor laser element includes a semiconductor substrate, a light emitting unit formed on a front surface of the semiconductor substrate, a first electrode formed on a surface of the light emitting unit and a second electrode formed on a back surface of the semiconductor substrate, so that the first electrode of the semiconductor laser element is electrically connected to the connection electrode on the submount through a solder material.

2. The semiconductor laser device according to claim 1, wherein, in the semiconductor laser element, a plurality of the light emitting units are formed on the front surface of the semiconductor substrate in the form of stripes, while being electrically separated from one another, with the first electrode being formed on each of the surfaces of the light emitting units, and a plurality of the connection electrodes are formed on the surface of the submount in the form of stripes.

3. The semiconductor laser device according to claim 2, wherein the semiconductor laser element is allowed to emit a plurality of laser beams having different oscillating wavelengths or the same oscillating wavelength.

4. The semiconductor laser device according to claim 2, wherein the semiconductor laser element has a light emission-point interval of 50 μm or less.

5. The semiconductor laser device according to claim 1, wherein the submount is made from at least one material selected from the group consisting of GaN, sapphire and $SiO_2$.

* * * * *